United States Patent [19]

McKenna

[11] Patent Number: 4,859,949

[45] Date of Patent: Aug. 22, 1989

[54] MAGNETIC RESONANCE SPECTROSCOPY APPARATUS

[75] Inventor: Gilbert W. McKenna, Revere, Mass.

[73] Assignee: Siemens Aktiengesellschaft, Berlin and Munich, Fed. Rep. of Germany

[21] Appl. No.: 148,713

[22] Filed: Jan. 26, 1988

[51] Int. Cl.⁴ ............................................. G01R 33/20
[52] U.S. Cl. ..................................... 324/321; 324/318
[58] Field of Search ................ 324/300, 307, 318, 322

[56] References Cited

U.S. PATENT DOCUMENTS

| | | | |
|---|---|---|---|
| 2,960,649 | 11/1960 | Bloch | 324/321 |
| 3,100,866 | 8/1963 | Zimmerman | 324/321 |
| 3,287,630 | 11/1966 | Gang | 324/321 |
| 3,462,677 | 8/1969 | Paitich | 324/321 |
| 3,512,078 | 5/1970 | Hall | 324/321 |
| 3,588,677 | 6/1971 | Kleiman | 324/321 |
| 3,796,946 | 3/1974 | Utsumi | 324/321 |
| 3,911,355 | 10/1975 | Lease | 324/321 |
| 4,088,944 | 5/1978 | Engler | 324/321 |
| 4,201,941 | 5/1980 | Fyfe | 324/321 |
| 4,240,033 | 12/1980 | Anderson | 324/321 |
| 4,275,350 | 6/1981 | Hill et al. | 324/321 |
| 4,581,583 | 4/1986 | Van Vliet | 324/321 |

*Primary Examiner*—Michael J. Tokar
*Attorney, Agent, or Firm*—Lawrence C. Edelman

[57] ABSTRACT

The present invention provides a clinical magnetic resonance spectrometer which overcomes many of the limitations of the laboratory instruments created thus far. A magnetic resonance spectroscopy apparatus for testing a sample contained within an elongated container having opposing ends, includes magnetic resonance excitation and detection apparatus having a vertically oriented central bore for receiving the sample to be tested and means for engaging the container by the opposing ends thereof and for spinning the container. Another embodiment includes magnetic resonance excitation and detection means having a vertically oriented central bore including a cylindrical radio frequency coil for surrounding at least a portion of a sample to be tested, the bore and coil both having open bottom ends, and means for raising and lowering a vertically oriented, elongated container, holding a sample to be tested, into and out of the bore and coil through the open bottom ends thereof.

34 Claims, 4 Drawing Sheets

MAGNETIC RESONANCE SPECTROSCOPY APPARATUS

BACKGROUND OF THE INVENTION

1. Field of the Invention

The present invention generally relates to magnetic resonance, high resolution spectroscopy machines and, in particular, to such machines used for testing large numbers of samples.

2. Statement of the Prior Art

Magnetic resonance or nuclear magnetic resonance has been used for spectral analysis of liquids and solids for many years. Recently renewed interest in an easy method for performing spectral analysis on a large number of samples has been sparked by certain lipoprotein lipids in blood plasma being tied to the presence of cancer in the body. It is hoped that such lipid measurements could be used as a screening test for early detection of cancer and as a means for monitoring the progress of cancer therapy and for optimization thereof. This would minimize patients' exposure to treatment side effects and improve the accuracy of cancer detection.

For these purposes, it is necessary to provide a spectroscopy apparatus which economically maintains several critical measurement parameters and is easy to operate and capable of handling large numbers of test samples. Thus far, the only instruments available have been research laboratory instruments which are not well suited to clinical application. Generally, the process is performed in a high intensity, static magnetic field. The field is made as uniform as possible by a process known as shimming which applies additional magnetic fields to compensate for incongruities in the main field. Once the sample is introduced into the field, it is spun at a constant rate and the field is again shimmed. Spinning the sample helps to further improve spectral resolution by averaging field inhomogeneities that cannot be removed by shimming and for inconsistencies in the sample.

Measurements are performed by administering pulses of radio frequency (r.f.) energy transmitted by a radio frequency coil which is located within the magnetic field and around the sample. Immediately after a pulse, the coil is monitored for radio frequency energy which is retransmitted from nuclei returning to the orientation caused by the magnetic field. The amount of r.f. energy received at various frequencies indicates the sample constituents. Different constituents absorb the transmitted r.f. energy at different frequencies.

Various approaches have been used for performing these operations within the high intensity field. One common approach uses a high field superconducting magnet system having a vertical bore into which the test tube samples are lowered. A rotor for an air motor is affixed to the sample test tube. The stator for the motor is located within the magnetic field, and the test tube and rotor are lowered into the magnetic field for each test. The portion of the sample to be tested extends past the stator into an area where the radio frequency coil is located. This coil is mounted as part of a formed glass cylinder which surrounds the volume which is actually excited and measured for magnetic resonance. Air is supplied to the stator to create an air bearing and to cause the rotor to spin. Once the rotor and test tube are up to speed, the magnetic resonance testing is performed and the rotor and test tube are then removed. Movement of the rotor and test tube into and out of the magnetic field and stator is commonly performed by compressed air working against the force of gravity. The sample is typically delivered to and from the bore by some mechanism such as a conveyor belt, rotating tray or a robot arm. This approach with several variations are disclosed in U.S. Pat. Nos. 2,960,649; 3,100,866; 3,287,630; 3,462,677; 3,512,078; 3,796,946; 3,911,533; 4,088,944; and 4,240,033.

Unfortunately, this approach has several limitations and drawbacks. Most expensively, a seperate rotor is required for each test tube. While the rotors maybe reused, the test tubes must either be cleaned or replaced in each rotor after a test. Cleaning is difficult because the rotor cannot suffer any abuse. It is typically precision made and balanced to minimize the introduction of spin vibrations into the sample. These vibrations affect the accuracy of the test. The rotors cannot be dented or stained with anything as this will cause an imbalance. Meanwhile, the rotors are expensive and frequent replacement even raises further the already high cost of using large numbers of rotors.

There are also limitations on the spin speed of the sample using this method. As compressed air and gravity are used to move the test tube and rotor into and out of the stator, using too much compressed air to spin the sample at higher speeds causes ejection of the rotor and sample from the apparatus and usually damage. Of course, breakage of the test tube either within or over the magnetic field can cause very expensive damage as the radio frequency coil may easily be damaged and any contamination within the apparatus must be thoroughly cleaned by means of disassembly.

A further disadvantage is the requirement for large amounts of very clean air and temperature contamination of the sample thereby. The air used in an air motor must be very clean because the size of the air bearing is small enough so that any oil, moisture or particles can affect or prevent operation. Half micron filtering is commonly used for this air. Because this air is also used for levitating the test tube and rotor, very large volumes are required. Lastly, temperature control is very important in hematology, and control of the motor air temperature is difficult at best given the compression and expansion to which it is subjected. This air is often in contact with the test tube and thus causes temperature instability. Means have been devised for applying temperature controlled air directly to the test tube in the area of the sample. Although helping to solve one problem, this contributes to air pressure build up beneath the test tube and rotor.

A still further disadvantage of previously used methods is the expense and bulk of the required sample handling apparatus. Often, this apparatus becomes large than the superconducting magnet. Apparatus of this nature also has a significant effect on the magnetic field of the magnet, which effect must be compensated for in the shimming process. Lastly, certain types of apparatus tend to malfunction when operating in the high magnetic field.

In view of these difficulties with the prior art, the desirable aspects of a clinical machine are typically as follows: ease of handling of the test tubes; safety factors in tube handling to prevent tube breakage within the bore and thus expensive bore replacement; ease of sample temperature stabilization including minimizing the effects of spin air on the temperature of the sample;

simplicity in the test tube handler to reduce the possibilities of failure; and rotor and test tube cost. Other desireable aspects include ease of aligning the test tube about the center of rotation including the repeatability of this alignment, ease of stabilizing both the rotation of the tube about the center of rotation and the spin speed, and minimized effects of the tube handling apparatus on the magnetic fields.

SUMMARY OF THE INVENTION

Accordingly, the present invention provides a clinical magnetic resonance spectrometer which overcomes many of the limitations of the laboratory instruments created thus far. A magnetic resonance spectroscopy apparatus for testing a sample contained within an elongated container having opposing ends, includes magnetic resonance excitation and detection means having a vertically oriented central bore for receiving the sample to be tested and means for engaging the container by the opposing ends thereof and for spinning the container. Another embodiment includes magnetic resonance excitation and detection means having a vertically oriented central bore including a cylindrical radio frequency coil for surrounding at least a portion of a sample to be tested, the bore and coil both having open bottom ends, and means for raising and lowering a vertically oriented, elongated container, holding a sample to be tested, into and out of the bore and coil through the open bottom ends thereof.

BRIEF DESCRIPTION OF THE DRAWINGS

The present invention is illustratively described in reference to the accompanying drawings, in which.

DETAILED DESCRIPTION OF THE DRAWINGS

Figure 1:
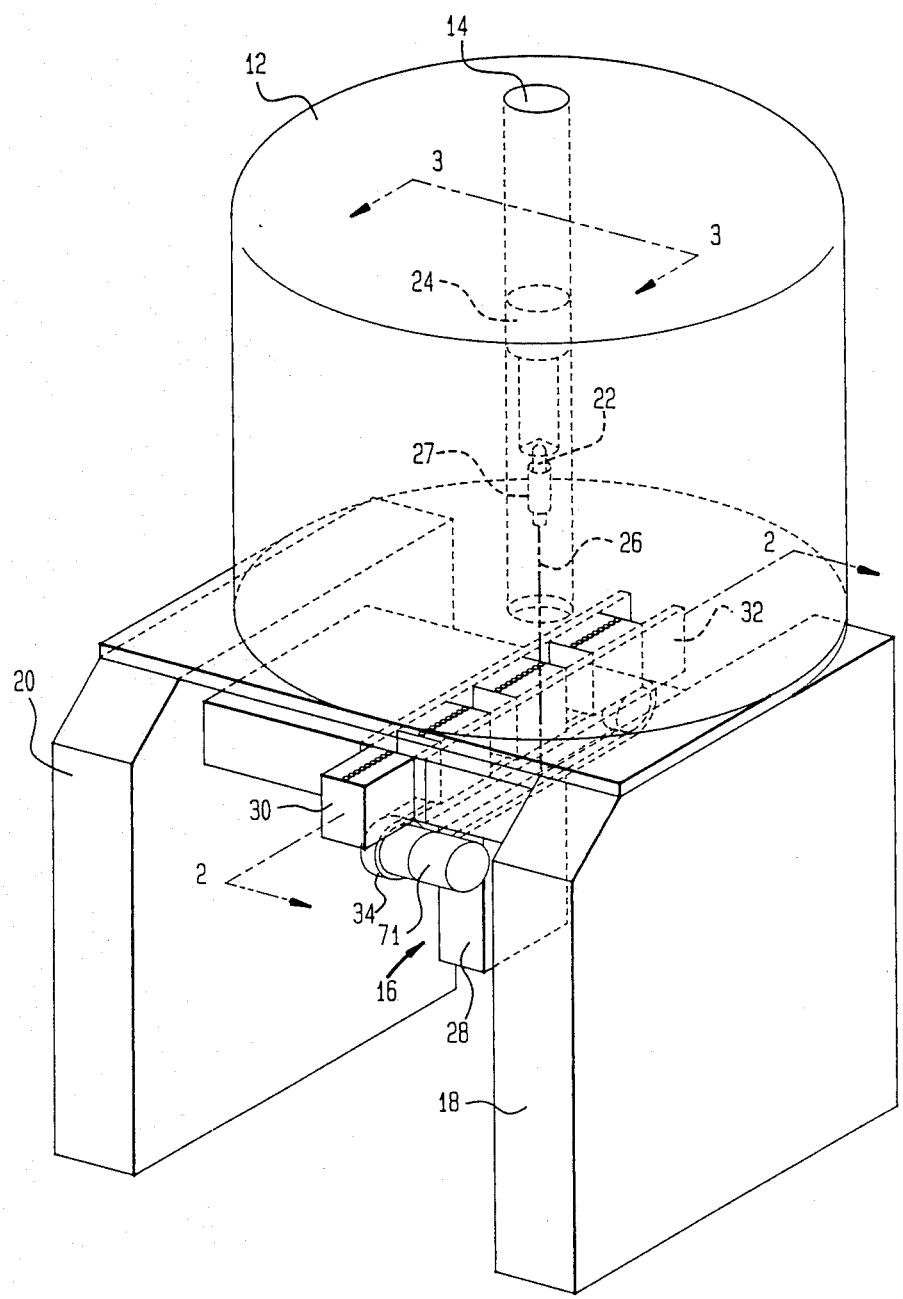
FIG. 1 is a perspective isometric view of a magnetic resonance apparatus constructed in accordance with the present invention.
Figure 2:
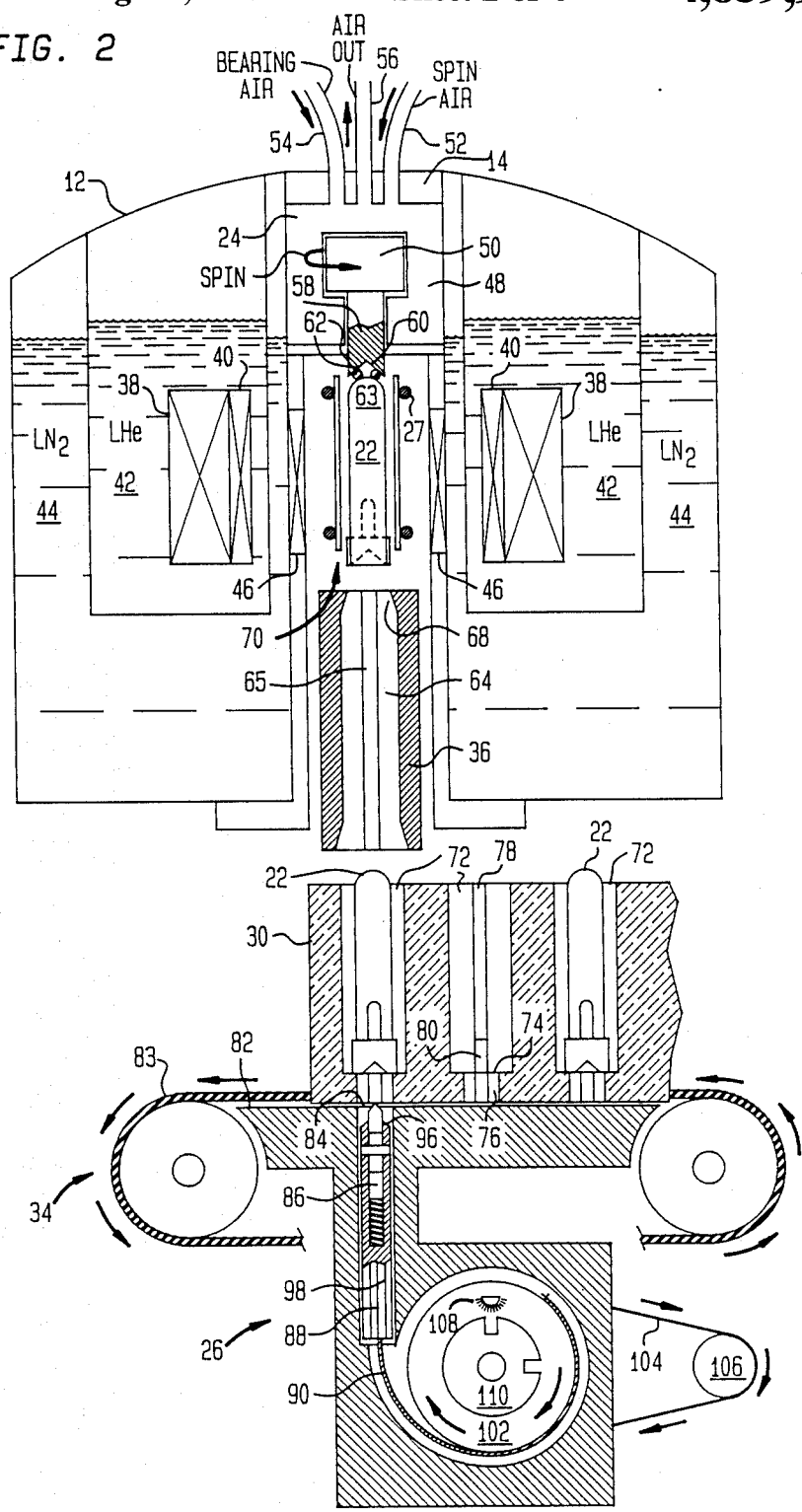
FIG. 2 is a sectional view of the apparatus of FIG. 1, taken along view lines 2—2 of FIG. 1.

FIG. 1 is an isometric view of a magnetic resonance spectrometer 10 generally including a superconducting magnet 12 having a central bore 14, a sample handling and testing apparatus 16, and support legs 18, 20. Testing is performed within the central bore 14 an elongated sample container or test tube 22, which is engaged at the top by an air driven spinner motor 24 and supported from the bottom by a ram 26. The container 22 is shown surrounded by a cylindrically shaped radio frequency coil 27. Movement of the ram 26 and therefore the test tube 22 is controlled by an apparatus 28. Sample test tubes 22 are placed in alignment with the ram 26 and central bore 14 by means of a sample holder 30 which moves through a channel 32 under the power and control of a conveyor apparatus 34. Each sample is in turn aligned with the ram 26 and central bore 14, FIG. 2 shows a partial view of the apparatus of FIG. 1 sectioned along lines 2—2 thereof. Generally shown are the superconducting magnet 12, the air-driven spinning motor 24, the radio frequency coil 27, a guide means 36, the sample holder 30 including a sample contained in a test tube 22, conveyor 34 for the sample holder 30, and the ram mechanism 26. The super conducting magnet 12 typically includes a superconducting coil 38 and one or more superconducting shim coils 40 which are maintained in a liquid helium bath 42 at approximately four (4) degrees Kelvin. The helium bath 42 is surrounded by a liquid nitrogen bath 44 which insulates and absorbs incoming heat to allow the liquid helium to last for longer periods before it needs refilling. The temperature of the liquid nitrogen is seventy-seven (77) degrees Kelvin. The liquid nitrogen tank 44 is further enclosed in a vacuum tank not shown including some form of insulation such as crinkled or crushed mylar for reducing radiant heat absorption. The superconducting magnet 12 discussed thus far is commercially available from Oxford Instruments of Oxford England.

The superconducting magnet 12 surrounds the vertically oriented central bore 14. Generally located within the central bore 14 are the air-driven motor 24, room temperature shim coils 46, the radio frequency coil or probe 27, and the guide means 36.

The air-driven motor 24 includes a stator portion 48 which is held in a fixed location within the central bore 14, and a rotor 50 which is captured by the stator 48 and free to rotate within the confines thereof. Air-driven motor 24 is powered by compressed air delivered thereto through a spin air feed line 52 which is caused by various jets (not shown) to angularly impinge on the rotor 50. Friction between the rotor 50 and stator 48 is minimized by maintaining a very thin air bearing between those members. For this purpose bearing air is delivered to the stator portion 48 via a feed line 54. The bearing distances which are maintained and designed into the air-driven motor 24 are on the order of 0.0005 or one-half of a thousandth of an inch or less. These bearing distances are less than the average thickness of a piece of human hair and allow the rotor to spin at a wide variety of speeds while absolutely minimizing the amount of friction between the members. Greater speeds are typically provided by increasing the amount of spin air delivered through feed line 52. As greater speed produces greater stresses between the rotor and stator, thus higher pressure bearing air must likewise be delivered through feed line 52 to maintain friction at a minimal amount. Given the inputting of this amount of air into the motor 24, means are provided in the form of an air outlet 56 for removing this air from the stator. The purpose of this is to reduce the amount of expended or used drive and bearing air which leaks into the area of the sample test tube and causes temperature contamination of the sample. Temperature is a very critical factor in hematology and thus means are provided for maintaining the temperature of the test sample within a few degrees of a predetermined temperature. To this end, removing expended air from drive motor 24 reduces or prevents temperature contamination from the drive and bearing air. Further temperature stabilization maybe had a bathing the sample test tube in temperature controlled air while it is located within the r.f. coil.

Air-driven motors of the type shown are generally known. However, for the purposes of the present invention it is necessary to use a motor which is composed entirely of non-ferous material. Aluminum stators are generally known, but rotors are typically steel. Examples of materials which maybe more suitable for rotor construction are plastic, ceramic and epoxys.

The rotor 50 includes a shaft 58 having a downwardly facing conically shaped receptacle 60 located at the bottom thereof. Retained within the conical receptacle 60 is a circular washer or O-ring 62. Together, these portions of rotor 50 form a means for engaging a sample containing test tube or container 22 by the upper end 63 thereof.

The sample test tubes or containers 22 are typically precision made with an outer diameter of approximately 5 mm. and a length which is less than five inches and typically three (3) inches (7.62 cm.). The upper end as shown in FIG. 2 is precision ground to have a hemispherical surface for contacting the receptacle 60. Test tubes of this nature are available from a few suppliers experienced in manufacturing test tubes to very high tolerances and are typically made by extruding glass over a carbon mandrel and then grinding the outer surface to the desired specifications. One supplier of such test tubes is Wilmad of New Jersey.

Further affixed within the central bore 14 is the guide means 36. Guide means 36 typically includes a central channel 64 having opposing guide slots 65 and a pair of alignment means 66 and 68. The lower alignment means 66 provides for centering of the sample test tube 22 and ram 26 as they enter the channel 64, and the upper alignment means is a conical frustum or frusto conical shoulder 68 which provides for centering of the sample test tube 22 and the ram 26 as the test tube reaches the test position shown at 70. The centering of conical shoulder 68 locates the lower end of the sample test tube 22 along the concentric center of the cylindrical radio frequency soil 27 and the spin center of rotor shaft 58.

The sample holder 30 is shown in a position where it vertically orients and aligns the sample test tube 22 with the approximate center of the channel 64. Sample holder 30 is placed in this position and otherwise controlled by the conveyor 34 which is controlled by means of sensor switches and a programmed stepper motor 71 of FIG. 1. The stepper motor 71 includes a rotor which has a plurality of magnetically identical rest or stopped positions. In this manner, whenever the sample holder 30 is in a position for a sample to be fed into the channel 64 and regardless of which sample, the magnetic profile provided by the stepper motor to the magnetic resonance apparatus is identical. Further, gearing may be provided between the stepper motor and the drive mechanism so that the distance traveled by the rotor between alignment of adjacent sample test tubes is exactly one revolution to further reproduce an identical magnetic profile for each sample being tested.

Sample holder 30 includes a plurality of bores 72 located vertically through the holder 30. Each bore is intended for holding a separate blood sample for testing and typically includes a lip 74 near the lower end thereof producing a reduced diameter opening 76 in the bottom of the bore. This allows entrance of the ram 26 into the bore but prevents the sample test tube 22 from dropping through the bore, thus causing it to be retained therein. Further included within each bore 72 is a ram guide channel 78 which maintains alignment of ram 26 in the approximate center of each bore 72. Further located near the bottom of each bore 72 and above the lip 74 is a sensor viewport 80. This sensor viewport is used to determine the absence or presence of a test tube sample in the bottom position within the bore 72. An infrared source is placed at one end of the bore 80 and an infrared detector located at the other end thereof and the presence or absence of test tube 22 is indicated by the absence or presence of the infrared signal, respectively.

Sample holder 30 rests on a support surface 82 and is propelled therealong by a conveyor belt 83 which is part of conveyor means 34. The support surface 82 includes an opening 84 formed therethrough in alignment with the central bore 14. Opening 84 is part of an extended channel 86 which maintains the ram 26 in alignment with the central bore 14. Ram 26 includes a rigid portion 88 and a flexible portion 90. Rigid portion 88 includes a conically shaped point 92, which is spring mounted within the rigid portion 88, for engaging the lower end of the sample test tube 22. The upper end 94 of rigid ram 88 includes a centering bevel 96 for engaging the alignment means 66 and 68 of the guide 36.

Flexible drive band 90 is typically a plastic band having compressive strength for supporting rigid ram 88 and dimensioned to maintain the width of rigid ram 88 at the limit created by lateral ribs 98. In this manner drive band 90 is likewise maintained in alignment with bore 14 by means of the guide channels 78 and 65. The other end of drive band 90 is affixed to a drive wheel 102 which is rotated for controlling movement and position of the entire ram 26. The angular position of drive wheel 102 is controlled by means of a drive belt 104 and a stepper motor 106. Further, the position of drive wheel 102 is sensed by means of a infrared light position sensor 108 used in conjunction with an indicator disk 110 which rotates with the drive wheel 102. This arrangement causes the rotor of stepper motor 106 to always be in the same position when the ram is at its highest position, thus providing an identical magnetic profile to the magnet 12 for each test procedure.

Figure 3:
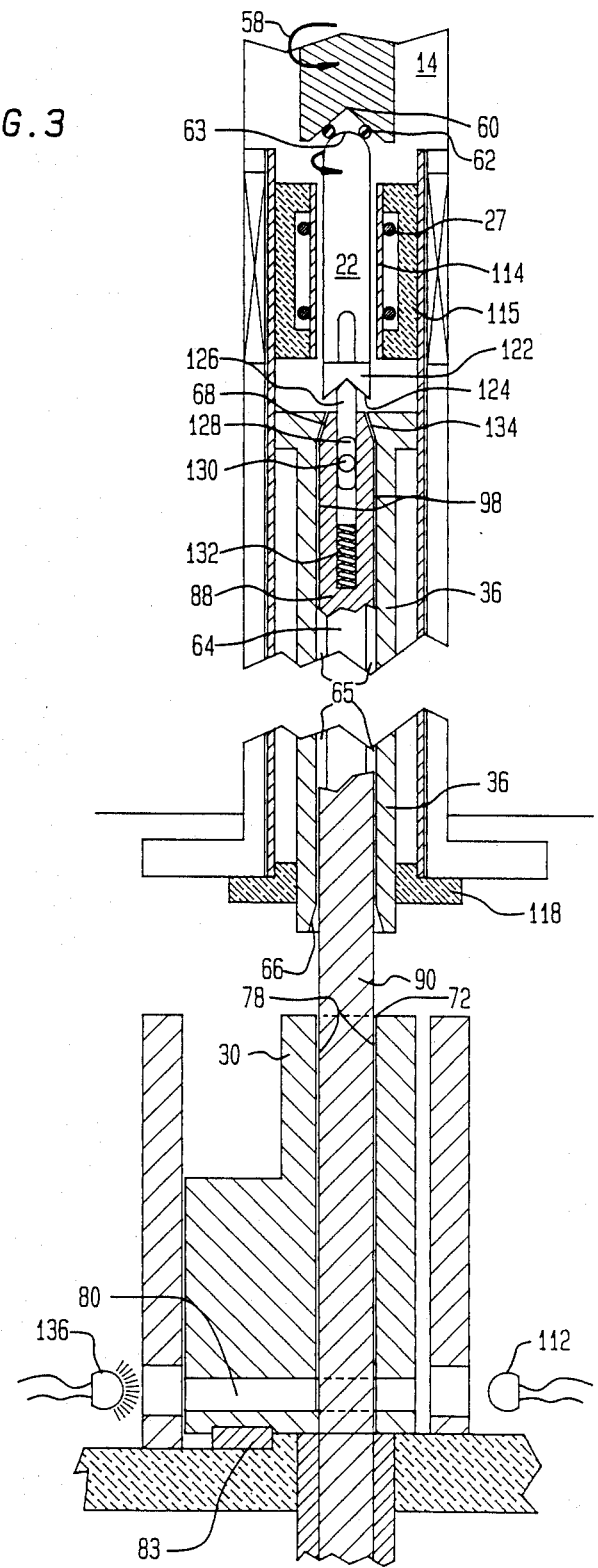
FIG. 3 is a sectional partial view of the apparatus of FIG. 1 taken along view lines 3—3 of FIG. 1.

FIG. 3 is a sectional partial view of the central bore 14 of FIG. 1 taken along view line 3—3. FIG. 3 shows greater detail of the central bore 14 including the radio frequency coil 27. The r.f. coil is cylindrical in shape and surrounds a cylindrical glass liner 114 into which the test tube 22 is placed and spun for testing. Coil 27 and liner 114 are mounted by a support means 115 having a member 118 which extends out of the bottom of the central bore 14 for removal and servicing. The upper end 63 of test tube 122 includes the precision ground hemispherical shape and engages the O-ring 62 located in the conical receptacle 60. The bottom end of test tube 22 carries a cap 122 having a downwardly facing conical receptacle 124. Receptacle 124 engages a spring-loaded point 126 of ram 26. Point 126 includes a slot 128 through which a rivet 130 retains the point 126 and prevents it from turning. A spring 132 maintains upward force on the point 126 for holding the test tube 22 in engagement with the O-ring 62.

The upper end of the rigid ram portion 88 also includes a conical bevel 134 which engages the alignment means 66 at the bottom of guide means 36 to center the ram 26 and further engages the frusto-conical shoulder 68 for centering the point 126 on the center line of rotor shaft 58.

FIG. 3 also shows rigid ram portion 88 including a pair of lateral ribs 98 on opposite sides thereof for engaging the guide grooves 78 and 65 and maintaining the rigid ram 88 in alignment with the central bore 14. As mentioned, the flexible band 90 maintains the width of the rigid ram portion 88 so that it too is guided by the guide slots 65.

FIG. 3 further shows the view bore 80 located through the test rube holder 30. An infrared light source 136 is illuminated constantly to provide sensing light through the view bore 80 for detection by the infrared sensor 112. When the band 90 is present in the bore 72, the infrared light is not obstructed. When the test tube 22 is at rest in the lowest position of the bore 72, as shown in FIG. 2, the infrared light is obstructed by sample cap so that the presence of the test tube 22 can be determined.

Lastly, FIG. 3 shows the conveyor belt 83 of the conveyor means 34 which positions the sample holder 30.

Although the present embodiment shows the combination of the means for engaging and for spinning into a single apparatus, the scope of the present invention should allow the use of separate means for these purposes.

Figure 4:
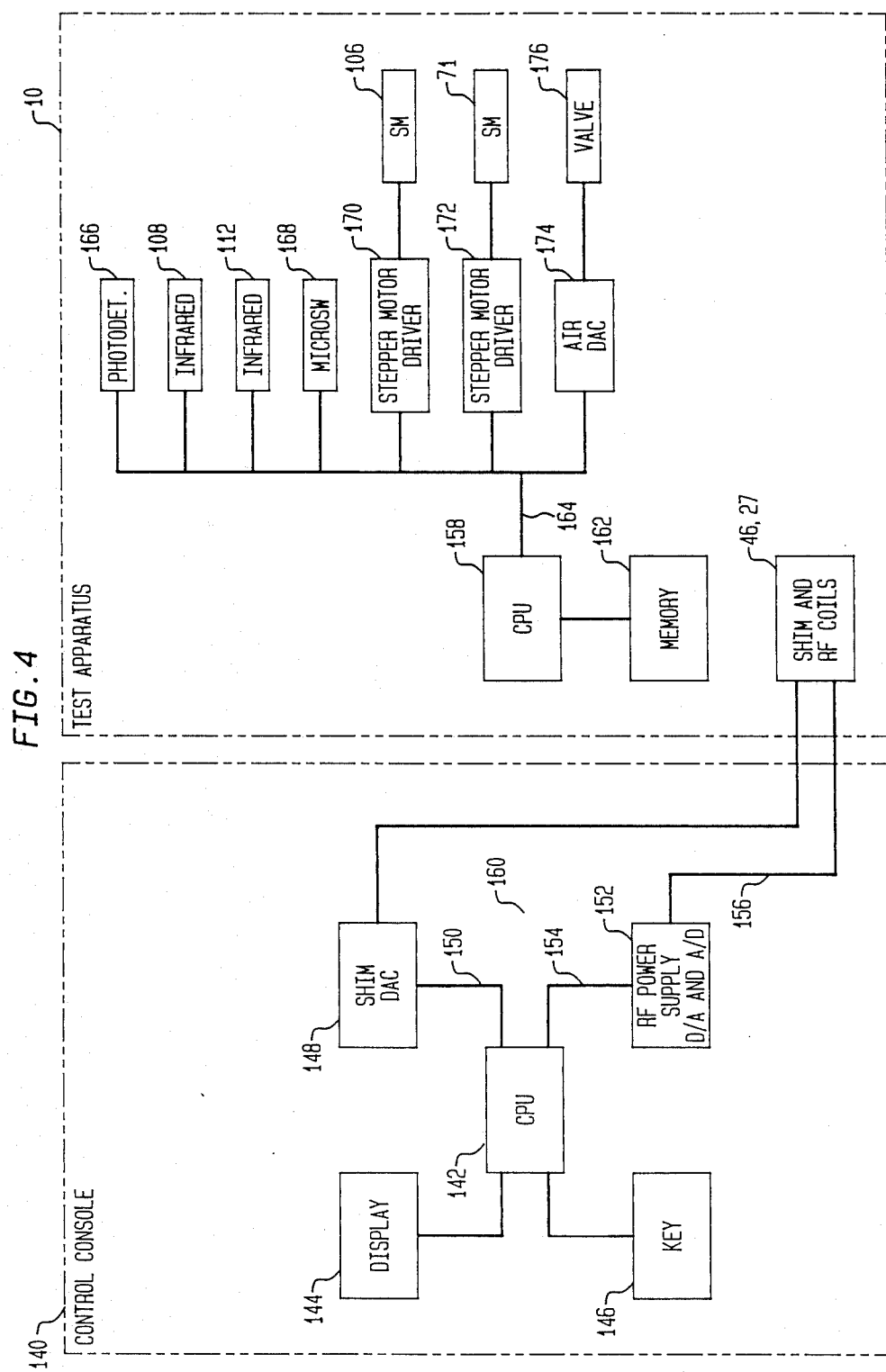
FIG. 4 is a block diagram of control circuit suitable for use with the embodiment of FIG. 1.

FIG. 4 shows a block diagram of circuitry suitable for use for controlling the described embodiments of the present invention. Distinction is made between that circuitry present in the test apparatus 10 and that circuitry which would normally be located in a separate control console 140. The control console 140 includes a central processing unit 142 having a display 144 and a control keyboard 146. This apparatus may take the form of a commonly available personal computer with appropriate control software. The remainder of the equipment in control console 140 includes interface components specific to the magnetic resonance apparatus 10. This control circuitry includes a digital-to-analog (D/A) converter 148 for the room temperature shim coils 46 of the apparatus 10. The shim converters 148 receive digital control signals from the CPU 142 over a control line 150 and convert those signals into controlled analog power for the shim coils 46.

The remaining interface circuitry includes the r.f. power supply 152 which incorporates digital-to-analog (D/A) converters and analog-to-digital (A/D) converters for interface with the r.f. coil 27. CPU 142 provides digital control signals over a control line 154 to the r.f. power supply 152. The digital-to-analog converters within the supply 152 deliver controlled radio frequency power to the r.f. coil 27 via the lines 156. The same lines 156 return radio frequency signals received by the r.f. coil 27, which r.f. signals are converted into digital data for the CPU 142 via the A/D converters in the r.f. power supply 152.

The CPU 142 is also connected to a small central processing unit or microcomputer 158 located in the test apparatus 10 via a bus 160. The test apparatus also includes memory 162 and another bus 164 for distributing control signals and sensing signals within the apparatus 10. Among the components interfaced by bus 164 are the infrared sensors 108 and 112 of FIGS. 2 and 3, respectively.

Additionally shown is a photo detector 166 which is present in the air-driven motor 24 and whose signal is dependent upon the rotational speed of the rotor 50. Photo detector 166 comprises a light source and sensor which are located outside of the central bore 14 and which communicate with the stator 48 and rotor 50 via a fiberoptic light connection which travels into the bore 14 to the motor 24 in order to minimize electrical interaction with the magnetic field.

Further shown is a microswitch 168 which determines the presence and position of a sample holder 30 along the surface 82. Also shown are a pair of stepper motor drivers 170, 172 which are used for powering the stepper motors 106 and 71 of FIGS. 2 and 1, respectively. Lastly shown is an air flow control digital-to-analog converter 174 and one or more air valves 176. The D/A converter 174 receives digital control signals from the CPU and converts these to analog drive signals for the control valves 176, thereby allowing computer control of the spin and bearing air fed to drive motor 24 via the feed lines 52 and 54.

THEORY OF OPERATION

To initiate the testing of samples, an operator places the sample test tubes in a sample holder 30, as shown in FIG. 1, and inserts it into the front of channel 32. The computer advances the sample holder 30 by means of signals from the microswitch 168 and the conveyor means 34 until the first bore 72 is in alignment with the channel 64 of guide means 36 and the opening 84 in support surface 82. If the infrared sensor 112 does not detect the presence of a test tube 22, the computer advances the sample holder 30 to align the next sequential bore and so on, until the sample holder is finished. If the presence of a test tube 22 is detected by infrared sensor 112, the ram is activated via stepper motor 106. Drive wheel 102 is rotated in the direction of the arrows, causing the ram 26 to move upward. The point 126 of ram 26 passes through the opening 84 and engages the downwardly facing conical receptacle 124 of test tube cap 122. Ram 26 continues to move upward, raising the test tube 22 through the channel 64. As the top of the rigid ram portion 86 passes the alignment bevel 66, alignment is maintained within the channel 64. Further, lateral ribs 98 of the rigid ram portion engage the guide slots 78 and 65 to further maintain alignment of the ram 26. When the beveled shoulders 134 of rigid ram portion 86 reach the frusto-conical shoulder 68, the ram is centered along the center of rotation of the rotor shaft 58.

At approximately the same time, the hemispherical top 63 of test tube 22 comes into contact with the O-ring 62 in the downward facing conical receptacle of rotor shaft 58. Within less than one second of the contact therebetween, the rotating shaft 58 accelerates the test tube 22 to its standard test speed of approximately 25 to 30 revolutions per second. Random contact between many test tubes and the O-ring 62 causes random or even wear of the O-ring 62, which is therefore not a critical problem. While the rotor shaft 58 is constantly spinning, the photo detector 166 is constantly monitoring its speed and the CPU 158 is maintaining that speed at a constant value through the use of the air D/A converter 174 and valves 176.

Once the test tube 22 is spinning, initial magnetic resonance tests are performed in order to determine the best setting for the room temperature shim coils 46. The CPU 142 includes software which can read the initial r.f. signals returned and calculate shim coil settings to compensate for field incongruities. These readings and adjustments to the shim coil power may be performed several times in order to shim the magnetic field to a very high degree of consistency, which may be critical for the test being performed. Once the r.f. signals returned from the coil 27 can no longer be improved upon by changes in the shim coil settings, a full spectrum of magnetic resonance tests may be performed on the sample. To this end, the sample is pulsed with different frequencies of r.f. energy and the received magnetic resonance r.f. signals are recorded for each pulsing frequency.

Once the resonance testing is completed, the ram 26 is lowered back through the channel 64 by means of the stepper motor 106 until it reaches its lowest position as indicated by the infrared sensor 108. At this point the infrared sensor 112 is tested to determine if the test tube 22 has returned to the sample holder 30. If infrared light is detected by the sensor 112, the ram 26 is again raised to its uppermost position and lowered in an attempt to retrieve the test tube. The apparatus incorporates a safety feature in that the rotor shaft 58 is constantly spinning, which typically insures that the test tube 22 will not stick and will follow the ram 26 down until it reaches the sample holder 30. Once the ram is down and a test tube 22 is sensed by sensor 112, the CPU 158 causes the stepper motor 71 to advance the sample holder 30 to the next sample to be tested.

SUMMARY

The embodiments of the present invention described above provide many advantages over the various apparatuses used in the prior art. These advantages include the safety and repeatability of sample handling, the elimination of great expense and structure for the sample handling apparatus, the accuracy and repeatability of spin centering of the test tube 22, the reduced amount of clean drive air required, the minimized effects of sample handling apparatus on the magnetic field allowing easier shimming and greater field consistency to be attained, the minimum amount of space required for the sample handling apparatus, the speed range of the air-driven motor 24, safety factors protecting the r.f. coil 27 from breakage of sample test tubes, and instantaneous acceleration of the test tubes 22 to avoid testing delays.

An important advantage of an enclosed air motor system as presently disclosed is the available speed range of the motor. Because the prior art devices used compressed air to lower test samples into and out of the central bore and therefore did not maintain the rotor in a captured situation, the amount of air which could be provided to the bottom of the rotor and sample is limited in such systems to that which counteracted the weight of the rotor and sample. As higher spinning speeds are required, so too must the flow of bearing air be increased. Going above the critical limits of the prior art systems usually resulted in ejection of the sample from the magnetic resonance apparatus. The prior art devices have been suitable for hematology because the high water or hydrogen content of blood and the consistency allows for adequate readings to be obtained within the limits of the prior art systems. Further, in the testing of liquids a phenomena called vortexing occurs above spin speeds of approximately 30 to 35 revolutions per second depending upon the consistency of the fluid. Although other means are available for preventing vortexing, such as the use of plugs within the sample, the availability of usable measurements below that speed range has still eliminated the need for higher speeds in prior art devices. Conversely, the apparatus of the present invention, including the air-drive motor 24, may be employed to test other samples besides blood which would require a higher spin speed.

The embodiments of the present invention described above are intended to be taken in an illustrative and not a limiting manner. Various modifications and changes may be made to the above embodiments without departing from the scope of the present invention as defined in the appended claims.

What is claimed is:

1. A magnetic resonance spectroscopy apparatus for testing a sample contained within an elongated container having opposing ends, the apparatus comprising:
magnetic resonance excitation and detection means having a vertically oriented central bore including a container receiving portion therein for receiving the sample to be tested; and
means for engaging the container by the opposing ends thereof when it is positioned within said bore, and for spinning the container.

2. The apparatus of claim 1, wherein the means for engaging and spinning includes an air driven motor means located within the central bore and above the container receiving portion thereof for engaging one end of the container and for causing the container to spin when so engaged.

3. The apparatus of claim 2, wherein the air driven motor means includes means for delivering drive air thereto for use in powering and lubricating the air driven motor means and means for removing used air therefrom for reducing contact between the used air and the container.

4. The apparatus of claim 3, wherein the air driven motor means includes a downwardly facing conical receptacle having a circular washer mounted thereon for engaging one end of the container.

5. The apparatus of claim 4, wherein the means for engaging and spinning includes a ram means located beneath the container for rotatably supporting the other end of the container and for causing engagement of the one end of the container with the motor means.

6. The apparatus of claim 5, wherein the ram means includes alignment means for centering the ram means.

7. The apparatus of claim 5, further comprising the elongated sample container having opposing ends with the one end being partially sphereical in shape for engaging the conical receptacle of the motor means.

8. The apparatus of claim 7, wherein the sample container is a test tube which is less than five inches long.

9. The apparatus of claim 7, wherein the other end of the container has a downwardly facing, conically shaped receptacle for contacting the ram means therein, and further wherein the ram means has a point for contacting the receptacle of the container.

10. The apparatus of claim 9, wherein the ram means includes spring means for biasing the point into contact with the receptacle of the other end of the container.

11. The apparatus of claim 2, wherein the magnetic resonance excitation and detection means includes a radio frequency coil located within the central bore and beneath the air driven motor means for exciting and measuring magnetic resonance within the sample to be tested, the radio frequency coil being generally cylindrical for surrounding at least a portion of the sample.

12. The apparatus of claim 11, wherein the radio frequency coil has a diameter adapted for physically reducing measuring sensitivity thereof for reducing the strength of any noise signals received thereby.

13. A magnetic resonance spectroscopy apparatus for testing a sample contained within an elongated container having opposing ends, the apparatus comprising:
magnetic resonance excitation and detection means having a vertically oriented central bore including a cylindrical radio frequency coil for surrounding a portion of a sample to be tested, the bore and coil both having open bottom ends; and
means for raising and lowering a vertically oriented, elongated sample container into and out of the bore and coil through the open bottom ends thereof.

14. The apparatus of claim 13, wherein the means for raising and lowering includes vertical guide means and a ram adapted to support the container and move it through the guide means.

15. The apparatus of claim 14, wherein the guide means includes alignment means for centering the ram when the container is within the coil.

16. The apparatus of claim 14, wherein the container has a bottom end with a conically shaped receptacle for contacting the ram and further wherein the ram has a conically shaped point for contacting the receptacle of the container.

17. The apparatus of claim 16, wherein the ram includes spring means for biasing the point into contact with the receptacle of the bottom end of the container.

18. The apparatus of claim 14, further comprising means for orienting the container vertically below the guide means and above the ram.

19. The apparatus of claim 18, wherein the means for orienting includes a container holder having a vertical bore passing therethrough, the top of the bore being adapted for receiving the container therethrough.

20. The apparatus of claim 19, wherein the bore of the holder includes a bottom opening adapted to allow the ram to pass therethrough and to prevent the container from passing therethrough.

21. The apparatus of claim 19, wherein the means for orienting includes a surface for supporting the holder and the surface includes an opening for allowing the ram to pass therethrough.

22. The apparatus of claim 14, wherein the means for orienting includes an electrical stepper motor with a rotor having magnetically identical stopped positions for providing an identical magnetic influence on the spectroscopy apparatus regardless of the stopped position of the rotor.

23. The apparatus of claim 14, wherein the means for raising and lowering includes a circular means for controlling the position of the ram and an electrical stepper motor having a rotor coupled to the circular means, the rotor having magnetically identical stopped positions for providing an identical magnetic influence on the spectroscopy apparatus regardless of the stopped position of the rotor.

24. The apparatus of claim 23, wherein the ram includes a rigid portion adapted to engage the container and a flexible portion adapted to be wrapped around the circular means.

25. The apparatus of claim 13, further comprising means located within the central bore and above the radio frequency coil for engaging and spinning the container and including an air driven motor means.

26. The apparatus of claim 25, wherein the air driven motor means includes means for delivering drive air thereto for use in powering and lubricating the air driven motor means and means for removing used air therefrom for reducing contact between the used air and the container.

27. The apparatus of claim 25, wherein the air driven motor means includes a downwardly facing conical receptacle having a circular washer mounted therein for engaging the container from above and for imparting spin thereto when so engaged.

28. The apparatus of claim 27, wherein the air driven motor means is adapted to be constantly spun while a container is being engaged therewith and later removed to provide for centering and easy removal of the container, respectively.

29. The apparatus of claim 25, wherein the air driven motor means includes a stator and a captured rotor.

30. A magnetic resonance spectroscopy apparatus for testing a sample contained within an elongated container having opposing ends, said apparatus comprising:
magnetic resonance excitation and detection means having a vertically oriented central bore including therein a container receiving portion for receiving the sample to be tested;
spinning means located within said container receiving portion of said bore, said spinning means including a spinning portion adapted to make frictional contact with a portion of said container for imparting spinning movement thereto; and
means for positioning said container within said bore for establishing a non-slip frictional contact between said spinning portion of said spinning means and a portion of said container, said frictional contact causing said container to spin within said bore.

31. Apparatus according to claim 30, wherein:
said spinning means includes an air driven motor means located within said central bore and above said container receiving portion thereof for engaging one end of said container and for causing said container to spin when so engaged.

32. Apparatus according to claim 31, wherein:
said air driven motor means includes means for delivering drive air thereto for use in powering and lubricating said air driven motor means and means for removing used air therefrom for reducing contact between said used air and said container.

33. Apparatus according to claim 32, wherein:
said air driven motor means includes a downwardly facing conical receptacle having a circular washer mounted thereon for engaging said one end of said container.

34. Apparatus of claim 31, wherein said means for positioning said container includes ram means located beneath said container for rotatably supporting an other end of said container and for causing frictional contact of said one end of said container with said air driven motor means when said ram means positions said container within said bore.

* * * * *